United States Patent
Sakawa et al.

(10) Patent No.: US 7,722,425 B2
(45) Date of Patent: May 25, 2010

(54) ELECTRON SOURCE MANUFACTURING METHOD

(75) Inventors: Seiichi Sakawa, Shibukawa (JP); Yoshinori Terui, Shibukawa (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 340 days.

(21) Appl. No.: 11/813,963

(22) PCT Filed: Jan. 13, 2006

(86) PCT No.: PCT/JP2006/300394
§ 371 (c)(1), (2), (4) Date: Jul. 13, 2007

(87) PCT Pub. No.: WO2006/075715
PCT Pub. Date: Jul. 20, 2006

(65) Prior Publication Data
US 2009/0023355 A1    Jan. 22, 2009

(30) Foreign Application Priority Data
Jan. 14, 2005    (JP) .............................. 2005-007012

(51) Int. Cl.
*H01J 9/04*  (2006.01)
*H01J 1/13*  (2006.01)
(52) U.S. Cl. .............................. 445/51; 455/23; 455/24; 455/25; 313/495
(58) Field of Classification Search ............. 445/23–25, 445/49–51; 313/309–311, 495–497
See application file for complete search history.

(56) References Cited

U.S. PATENT DOCUMENTS

| | | | | | |
|---|---|---|---|---|---|
| 3,711,908 | A | * | 1/1973 | Broers | 445/50 |
| 4,325,000 | A | * | 4/1982 | Wolfe et al. | 313/336 |
| 4,468,586 | A | * | 8/1984 | Hohn | 313/336 |
| 4,482,838 | A | | 11/1984 | Ishii et al. | |
| 4,528,474 | A | * | 7/1985 | Kim | 313/346 R |
| 5,449,968 | A | | 9/1995 | Terui et al. | |

FOREIGN PATENT DOCUMENTS

| | | |
|---|---|---|
| JP | 54-51470 | 4/1979 |
| JP | 54 51472 | 4/1979 |
| JP | 1-299731 | 12/1989 |

(Continued)

OTHER PUBLICATIONS

U.S. Appl. No. 12/443,032, filed Mar. 26, 2009, Terui, et al.

(Continued)

*Primary Examiner*—Bumsuk Won
*Assistant Examiner*—Nathaniel J Lee
(74) *Attorney, Agent, or Firm*—Oblon, Spivak, McClelland, Maier & Neustadt, L.L.P.

(57) ABSTRACT

An electron source excellent in the uniformity in current emission distribution is provided certainly and at a low cost.

A process for producing an electron source having an electron emitting portion at one end of a rod, which comprises a step of forming the electron emitting portion by machining, and a step of removing a damaged layer at the surface of the formed electron emitting portion by chemical polishing or electrolytic polishing.

3 Claims, 5 Drawing Sheets

FOREIGN PATENT DOCUMENTS

| | | |
|---|---|---|
| JP | 1 299731 | 12/1989 |
| JP | 9-223453 | 8/1997 |
| JP | 2003 324050 | 11/2003 |
| WO | 2004 073010 | 8/2004 |

OTHER PUBLICATIONS

Tuggle, D. et al., "Application of a Thermal Field Emission Source for High Resolution, High Current e-beam Microprobes", J. Vac. Sci. Technol., vol. 16, No. 6, pp. 1699-1703, 1979.

Fransen, M. J. et al., "On the Electron-Optical Properties of the Zro/W Schottky Electron Emitter", Advance in imaging and Electron Physics, vol. III, pp. 91-166, 1999.

Tuggle, D. W., "Emission Characteristics of the ZrO/W Thermal Field Electron Source", J. Vac. Sci. Technol. vol. B3, No. 1, pp. 220-223, 1985.

* cited by examiner

ELECTRON SOURCE MANUFACTURING METHOD

TECHNICAL FIELD

The present invention relates to a process for producing an electron source for e.g. a scanning electron microscope, an Auger electron spectroscope, an electron beam lithography machine or a wafer inspection apparatus and particularly to a process for producing an electron source suitable for an electron beam lithography machine.

BACKGROUND ART

In recent years, in order to obtain an electron beam having higher brightness and longer operating life than a thermionic cathode, an electron source (hereinafter referred to as a ZrO/W electron source) employing a cathode made of a needle electrode of tungsten single crystal provided with a covering layer comprising zirconium and oxygen has been used (Non-Patent Document 1).

The ZrO/W electron source is one wherein a diffusing source made of zirconium oxide is provided on a needle cathode of tungsten single crystal having an axial orientation being <100> orientation, so that zirconium and oxygen are diffused to form a covering layer (hereinafter referred to as a ZrO covering layer). By this ZrO covering layer, the work function of the (100) crystallographic plane of tungsten single crystal is reduced to a level of from 4.5 eV to 2.8 eV, and only the very small crystallographic facet corresponding to the (100) crystallographic plane formed at the forward end of the cathode becomes an electron emission area, whereby an electron beam having a higher brightness than by a conventional thermionic cathode can be obtained, and yet this electron source has such a characteristic that it has a longer operating life. Further, such an electron source has characteristics such that it is more stable than a cold field emission electron source and is operable even under a low vacuum degree and thus easy to use (Non-Patent Document 2).

As shown in FIG. 1, in the ZrO/W electron source, a needle cathode 1 of tungsten having <100> orientation which emits an electron beam is fixed by e.g. welding to a predetermined position of a tungsten filament 3 provided on conductive terminals 4 fixed to an insulator 5. A zirconium- and oxygen-diffusing source 2 is formed at a portion of the cathode 1. Although not shown in the drawings, the surface of the cathode 1 is covered with a ZrO covering layer.

The cathode 1 is Joule heated by the filament 3 and used usually at a temperature of about 1,800 K. Accordingly, the ZrO covering layer on the surface of the cathode 1 will be lost by evaporation. However, from the diffusing source 2, zirconium and oxygen will diffuse and will be continuously supplied to the surface of the cathode 1, and consequently, the ZrO covering layer will be maintained.

When the ZrO/W electron source is used, the forward end of the cathode 1 is disposed between a suppressor electrode 6 and an extractor electrode 7 (FIG. 2). To the cathode 1, a high voltage negative against the extractor electrode 7 is applied and to the suppressor electrode 6, a negative voltage at a level of a few hundred volts against the cathode 1 is applied to suppress thermionic electrons from the filament 3.

In a CD-SEM or a wafer inspection apparatus to be used at a low accelerating voltage, the ZrO/W electron is source is operated at an angular intensity of from 0.1 to 0.2 mA/sr for such reasons that the probe current is stable and the energy spread can be suppressed.

On the other hand, in an electron beam lithography apparatus, an Auger electron spectroscope, etc., a throughput is of importance, and accordingly, the electron source is operated at a high angular intensity at a level of 0.4 mA/sr. In such an application where a throughput is of importance, operation at a still higher angular intensity is desired, and an operation at an angular intensity as high as 1.0 mA/sr may sometimes be required.

However, with the ZrO/W electron source, (1) during the operation at a high angular intensity, the upper limit of the angular intensity is at a level of 1.0 mA/sr, and (2) at that time, the extraction voltage applied between the cathode and the extractor electrode is high at a level of at least 4 kV, whereby the field intensity at the forward end of the chip will be remarkably high at a level of from $0.4\times10^9$ to $1.0\times10^9$ V/m, and the failure frequency due to arc discharge tends to be high (Non-Patent Document 3).

In order to solve such problems, the present inventors have previously proposed an electron source provided with a cathode made of a single crystal of tungsten or molybdenum with its surface covered by a covering layer of oxygen and a metal element selected from Groups 2A, 3A and 4A of the Periodic Table, which has a truncated cone shape with a total conical angle of at least 25° and at most 95° with its upper surface being a flat electron emission surface with a diameter of at least 5 μm and at most 200 μm (Patent Document 1).

Non-Patent Document 1: D. Tuggle, J. Vac. Sci. Technol. 16, p 1699 (1979)

Non-Patent Document 2: M. J. Fransen, "On the Electron-Optical Properties of the ZrO/W Schottky Electron Emitter", ADVANCES IN IMAGING AND ELECTRON PHYSICS, VOL. III, p 91-166, 1999 by Academic Press.

Non-Patent Document 3: D. W. Tuggle, J. Vac. Sci., Technol. B3(1), p 220 (1985).

Patent Document 1: WO2004/073010A1

DISCLOSURE OF THE INVENTION

Problems to be Solved by the Invention

However, by a research by the present inventors, it has been found that the above-mentioned conventional electron sources are still unsatisfactory with respect to the uniformity in the emission current density. Such a situation will be described below with reference to a specific example.

Firstly, in a conventional process for producing an electron source, a tungsten filament 3 was fixed to conductor terminals 4 soldered to an insulator 5, by spot welding (FIG. 1). Then, at one end portion of a single crystal rod 20 made of tungsten having <100> orientation processed into a columnar shape by machining, a conical portion 8 having a total angle of 90° was formed by means of a diamond paste and a grinder, and further, the apex of the conical portion was ground by an abrasive film coated with a diamond abrasive, to form a flat portion 9 having a diameter of 20 μm (FIG. 3).

This single crystal rod 20 was fixed to the above filament by spot welding. Such a single crystal rod 20 functions as a cathode 1. Further, zirconium hydride was pulverized and mixed with isoamyl acetate to form a paste, which was applied to a part of the cathode 1. After isoamyl acetate was evaporated, the cathode was introduced into an apparatus as shown in FIG. 2. The forward end of the cathode 1 was disposed between a suppressor electrode 6 and an extractor electrode 7. Further, in the apparatus of FIG. 2, the distance between the forward end of the cathode 1 and the suppressor electrode 6 is 0.15 mm, the distance between the suppressor electrode 6 and the extractor electrode 7 is 0.8 mm, the pore size of the extractor electrode 7 is 0.8 mm, and the pore size of the suppressor electrode 6 is 0.8 mm.

The filament 3 is connected to a filament-heating power source 16 and further connected to a high voltage power source 15, and a negative high voltage against the extractor electrode 7 i.e. extraction voltage −Vex will be applied.

Further, the suppressor electrode 6 is connected to a bias power source 14, and a further negative voltage against the cathode 1 and the filament 3 i.e. bias voltage −Vb will be applied. Thermionic electrons emitted from the filament 3 will thereby be shielded.

The total emission current It from the electron source is measured by an ammeter 17 disposed between a high voltage power source 15 and an earth.

The electron beam 18 emitted from the forward end of the cathode 1 will pass through the hole of the extractor electrode 7 and reach a phosphorous screen 10.

At the center of the phosphorous screen 10, there is an aperture 11 (a small pore), and a probe electric current Ip passed through the aperture 11 and reached a cup-shaped electrode 12, will be measured by an electric current ammeter 17. Further, when a solid angle calculated from the distance between the aperture 11 and the forward end of the cathode 1 and the inner diameter of the aperture 11, is represented by $\omega$, the angular intensity will be Ip/$\omega$. Further, the aperture 11 and the cup-shaped electrode 12 are movable from the vacuum system, and the emission current distribution can be measured.

Then, the interior of the apparatus was evacuated to an ultrahigh vacuum of $3 \times 10^{-10}$ Torr ($4 \times 10^{-8}$ Pa) whereupon an electric current was conducted to the filament 3 to is heat the cathode 1 at 1,800 K thereby thermally decomposing $ZrH_2$ to obtain metal zirconium. Further, oxygen gas was introduced to bring the interior of the apparatus to $3 \times 10^{-6}$ Torr ($4 \times 10^{-4}$ Pa), whereby metal zirconium was oxidized to form a diffusing source of zirconium and oxygen.

The interior of the apparatus was again evacuated to an ultrahigh vacuum of $3 \times 10^{-10}$ Torr ($4 \times 10^{-8}$ Pa) and while the cathode was maintained at 1,750 K, a voltage of bias voltage −Vb=−500 V was applied to the suppressor, and then a high voltage of extraction voltage −Vex=−4 kV was applied and maintained for a few hours, and when the emission current was stabilized, the emission current distribution measurement was carried out with respect to the probe current Ip.

FIG. 4 shows the emission current distribution calculated as the angular intensity, but it is not a smooth distribution, and non-uniformity is observed. By such non-uniformity, there will be a problem such that the epaxial current fluctuates, or the electron beam irradiation tends to be non-uniform.

According to the results of the study by the present inventors, the above-mentioned non-uniformity of the emission current distribution is considered to be due to a surface damage resulting at the time of processing a single crystal rod into a conical shape, and the depth of the damaged layer depends on the roughness of abrasive grains at the time of machining or mechanical polishing, but may be estimated to reach a few tens micrometer ("SURFACE ANALYSIS BY X-RAY TOPOGRAPHY AND ETCHING DURING THE PREPARATION OF SIGNAL CRYSTAL SURFACES" U. Linke and W. U. Kopp, Microstructural Sciences, Vol. 9, 1981, p 299-308).

Especially, with an electron source having a flat portion provided as an electron emission portion at the apex of the conical portion, if the diameter of the flat portion is small, such a flat portion 9 exposes a damaged layer 19 since cutting is done through the damaged layer 19 formed during the processing of the conical portion, as illustrated in FIG. 5. Accordingly, non-uniformity of the current emission distribution tends to be remarkable.

Means to Solve the Problems

Under the above-described circumstances, the present inventors have conducted extensive studies and as a result, have solved the above problems and arrived at the present invention.

Thus, the present invention provides the following.

(1) A process for producing an electron source having an electron emitting portion at one end of a rod, which comprises a step of forming the electron emitting portion by machining, and a step of removing a damaged layer on the surface of the formed electron emitting portion by chemical polishing or electrolytic polishing.

(2) The process for producing an electron source according to the above (1), wherein the step of forming the electron emitting portion by machining comprises a step of forming a conical portion and a step of forming a flat portion at the apex of the conical portion.

(3) The process for producing an electron source according to the above (2), wherein after the step of forming a flat portion at the apex of the conical portion, the step on removing the damaged layer by chemical polishing or electrolytic polishing is carried out.

(4) The process for producing an electron source according to the above (2) or (3), wherein after the step of forming the emitting portion by machining and after the step of forming a conical portion, the step of removing the damaged layer by chemical polishing or electrolytic polishing is carried out.

(5) A process for producing an electron source, which comprises forming a conical portion to constitute an electron emitting portion at one end of a rod by machining, removing a damaged layer of the conical portion by chemical polishing or electrolytic polishing, then forming a flat portion at the apex of the conical portion by machining, and removing a damaged layer of the flat portion by chemical polishing or electrolytic polishing.

(6) The process for producing an electron source according to any one of the above (1) to (5), wherein the rod is made of a single crystal of molybdenum or tungsten having a <100> orientation, and at the electron emitting portion has at least one metal element selected from the group consisting of Groups 2, 3, and 4 of the Periodic Table or a compound thereof, as a diffusing source.

(7) The process for producing an electron source according to the above (6), wherein the metal element is at least one member selected from the group consisting of zirconium, titanium, scandium, yttrium, rare earth elements, barium, beryllium, magnesium, calcium, strontium and hafnium.

Effects of the Invention

According to the process of the present invention an electron source excellent in the uniformity of the current emission distribution having removed a damaged layer of the electron emitting portion formed by machining, can be obtained certainly and at a low cost. Thus, it is possible to constantly provide an electron source for e.g. a scanning electron microscope an Auger electron spectroscope, an electron beam lithography machine or a wafer inspection apparatus, especially a highly reliable electron source particularly useful for an electron beam lithography machine.

Further according to the process for producing an electron source of the present invention, even for an electron source made of a rod wherein the electron emitting surface is not a machined single crystal, it is possible to make the emission current distribution is uniform by the present invention.

A: After forming a conical portion
B: After electrolytic polishing (first stage)
C: After forming a flat portion
D: After electrolytic polishing (second stage)

Figure 7:
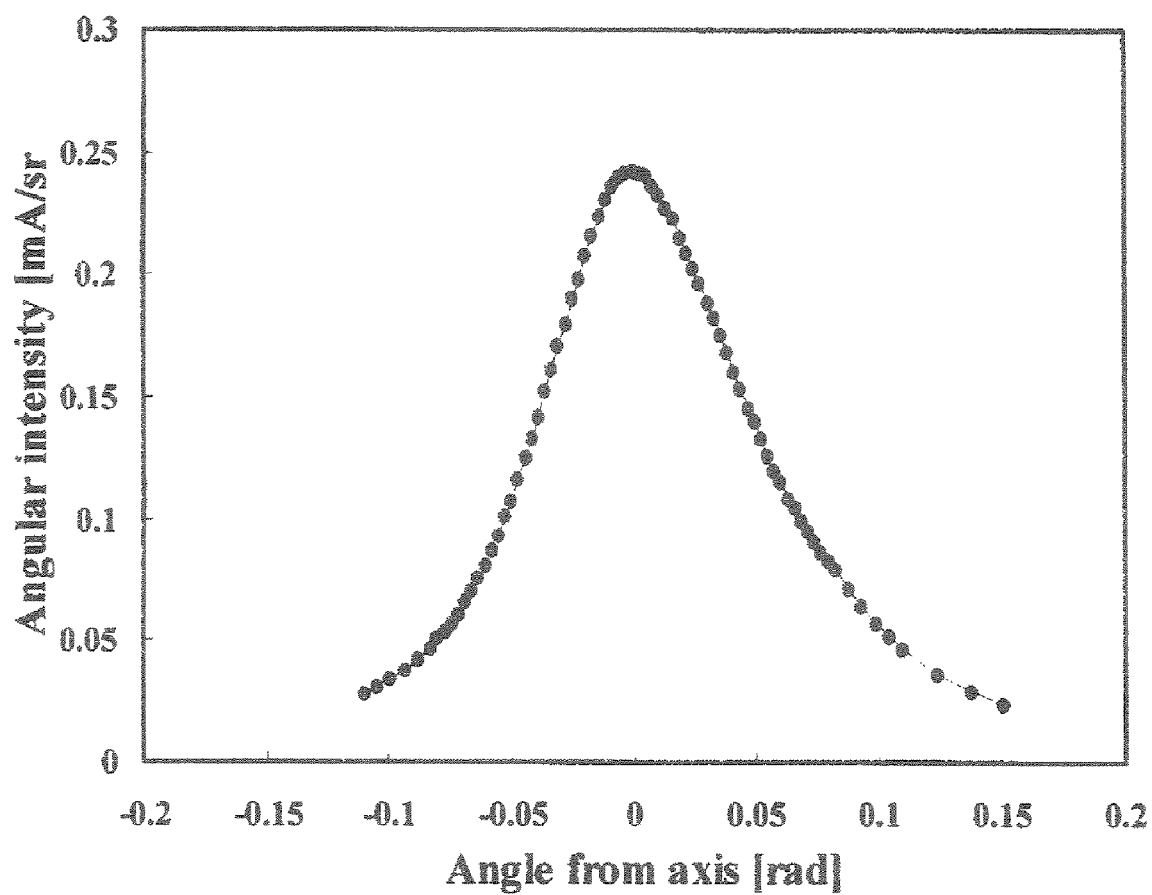

FIG. 7 shows an example of measurement of the emission current distribution of the present invention (Example).

MEANINGS OF SYMBOLS

1: Cathode
2: Diffusing source
3: Filament
4: Conductive terminal
5: Insulator
6: Suppressor electrode
7: Extractor electrode
8: Conical portion
9: Flat portion
10: Phosphorous screen
11: Aperture
12: Cup-shaped electrode
13: Electric current ammeter for measuring probe electric current
14: Bias power source
15: High voltage power source
16: Filament-heating power source
17: Ammeter for measuring total emission current
18: Emitted electron beam
19: Damaged layer
20: Single crystal rod

BEST MODE FOR CARRYING OUT THE INVENTION

Now, the present invention will be described with reference to a ZrO/W electron source as one of specific embodiments. However, it should be understood that the present invention is by no means restricted thereto.

In the present invention, at an end portion of a single crystal rod-shaped cathode of tungsten or molybdenum having <100> orientation thereinafter also referred to simply as "the rod"), a conical portion is formed by machining such as mechanical polishing. At that time, a damaged layer will be formed at the surface of the conical portion, but it is essential to thereafter remove such a damaged layer by applying electrolytic polishing or chemical polishing. By this operation, it is possible to maintain the uniformity of the electron beam generated from the electron emitting portion of the electron source.

Figure 6:
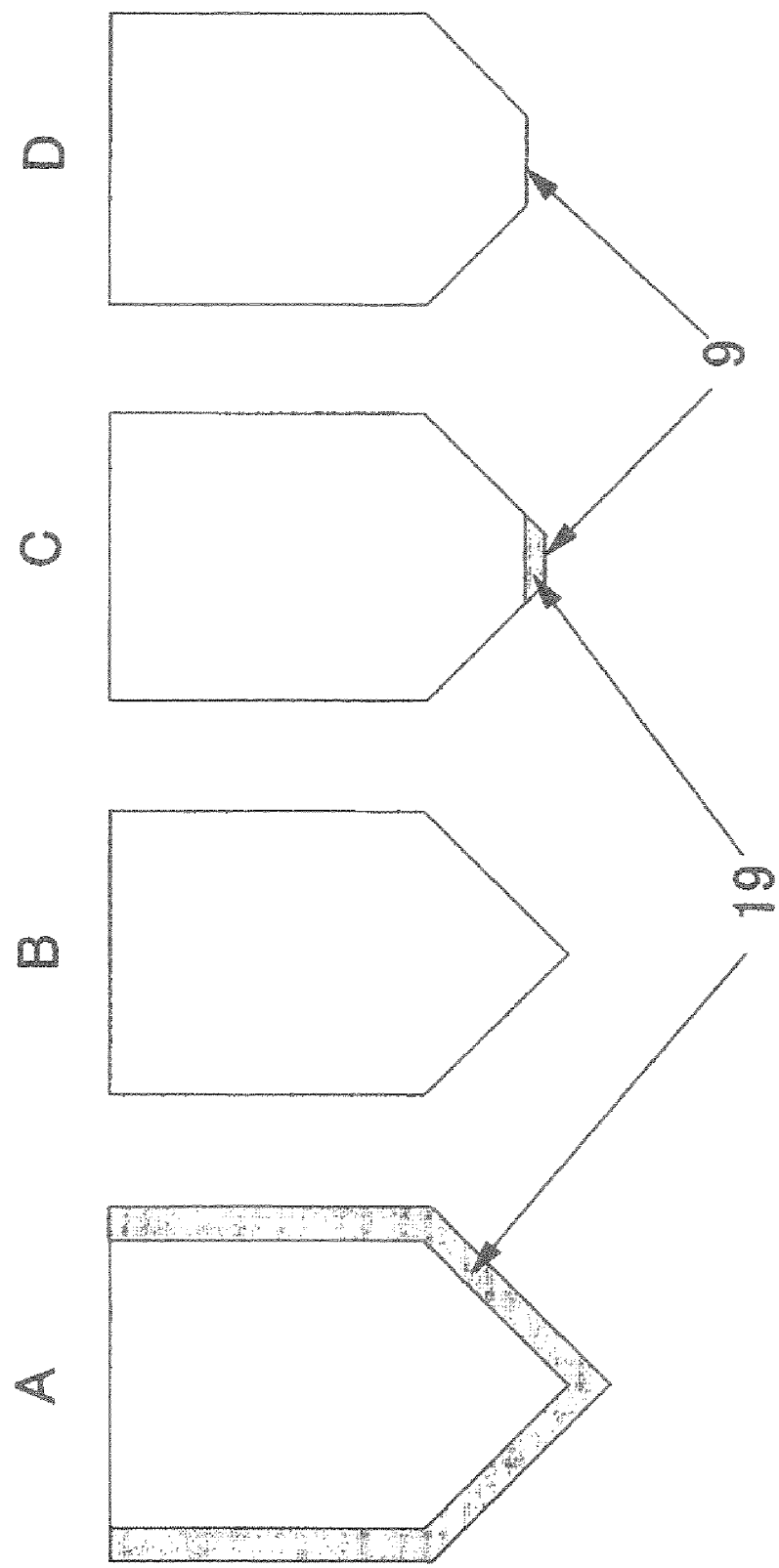
FIG. 6 is a schematic view illustrating the method for forming a flat portion by the present invention.

Further, the apex of the conical portion is subjected to machining such as mechanical polishing to form a flat portion at the apex of the conical portion. Also at that time, a damaged layer will be formed at the surface of the flat portion, and it is more preferred to carry out electrolytic polishing or chemical polishing again to remove such a damaged layer, whereby the above-mentioned effect can be secured (FIG. 6).

In the present invention electrolytic polishing may be carried out only after forming the flat portion without carrying out electrolytic polishing or chemical polishing after forming the conical portion. However, in such a case, particularly in a case where the diameter of the flat portion is small, the damaged layer after forming the conical portion is likely to be exposed on the flat portion, and such a damaged layer may sometimes not be removed even if electrolytic polishing or chemical polishing is carried out after forming the flat portion.

Further, if electrolytic polishing or chemical polishing is carried out excessively after forming the flat portion, the edge of the flat portion will be polished to finally become a shape close to a spherical surface, whereby the desired shape may not sometimes be maintained. In the present invention, it is therefore preferred to carry out electrolytic polishing or chemical polishing at two stages i.e. after forming the above-mentioned conical portion and after forming the flat portion at the apex of the conical portion.

Here, electrolytic polishing and chemical polishing to be used in the present invention are not particularly limited, and any conventional methods may be employed. The chemical polishing is not limited to a wet method and includes a dry method.

The rod functions as a cathode, and it is used in such a state that its surface is covered with oxygen and at least one metal element selected from the group consisting of Groups 2, 3, and 4 of the Periodic Table.

For example, in the case of a ZrO/W electron source, zirconium hydride is pulverized and mixed with an organic solvent such as isoamyl acetate to form a paste, which is then applied to a part of a cathode, whereupon the cathode is heated in an oxygen atmosphere of at most about $1 \times 10^{-6}$ Torr ($1 \times 10^{-4}$ Pa) to thermally decompose $ZrH_2$ and further oxidized to form a diffusing source of zirconium and oxygen and at the same time, the surface of the cathode is covered with zirconium and oxygen.

Then, the above cathode is disposed between an extractor electrode 7 and an suppressor electrode 6 and an electron emission is carried out by applying a negative high voltage of a few kilovolts to the cathode against the extractor electrode, applying a negative voltage of a few hundred volts to the suppressor electrode against the cathode, and heating the cathode 1 at from 1,500 to 1,900 K.

Further, as a suitable electron source for embodying the process of the present invention, an electron source may be mentioned which has, as mentioned above, a rod made of a single crystal of molybdenum or tungsten having <100> orientation and having a diffusing source capable of forming a covering layer made of oxygen and at least one metal element selected from the group consisting of Groups 2, 3, and 4 of the Periodic Table. Here, the above-mentioned element capable of forming the covering layer may specifically be at least one element selected from the group consisting of zirconium, titanium, scandium, yttrium, rare earth elements, barium, beryllium, magnesium, calcium, strontium and hafnium.

Further, the above element may be in any form so long as it is the element itself or the element which becomes an oxide by oxidation treatment.

Now, the present invention will be described in further detail with reference to Example. However, it is should be understood that the present invention is by no means restricted to such Example.

EXAMPLE

A tungsten filament was fixed by spot welding to conductive terminals brazed to electric glass.

At an end of a single crystal tungsten chip having <100> orientation, a conical portion with a total angle of 90° was formed by means of a diamond paste and a grinder. Then, the single crystal tungsten chip was chucked so that the conical portion was immersed in an aqueous sodium hydroxide solution, and a voltage of 10 V was applied for one minute between the chucked portion and an electrode set in the solution to carry out electrolytic polishing.

Then, the apex of the conical portion was ground by an abrasive film coated with a diamond abrasive to form a flat portion having a diameter of 20 μm (rod). Such a rod was welded to a filament made of tungsten welded to conductive terminals brazed to electric glass. Again, the rod was set so that the conical portion was immersed in an aqueous sodium hydroxide solution, and a voltage of 3 V was applied again for one minute between the conductive terminals and an electrode set in the solution to carry out electrolytic polishing.

Figure 1:
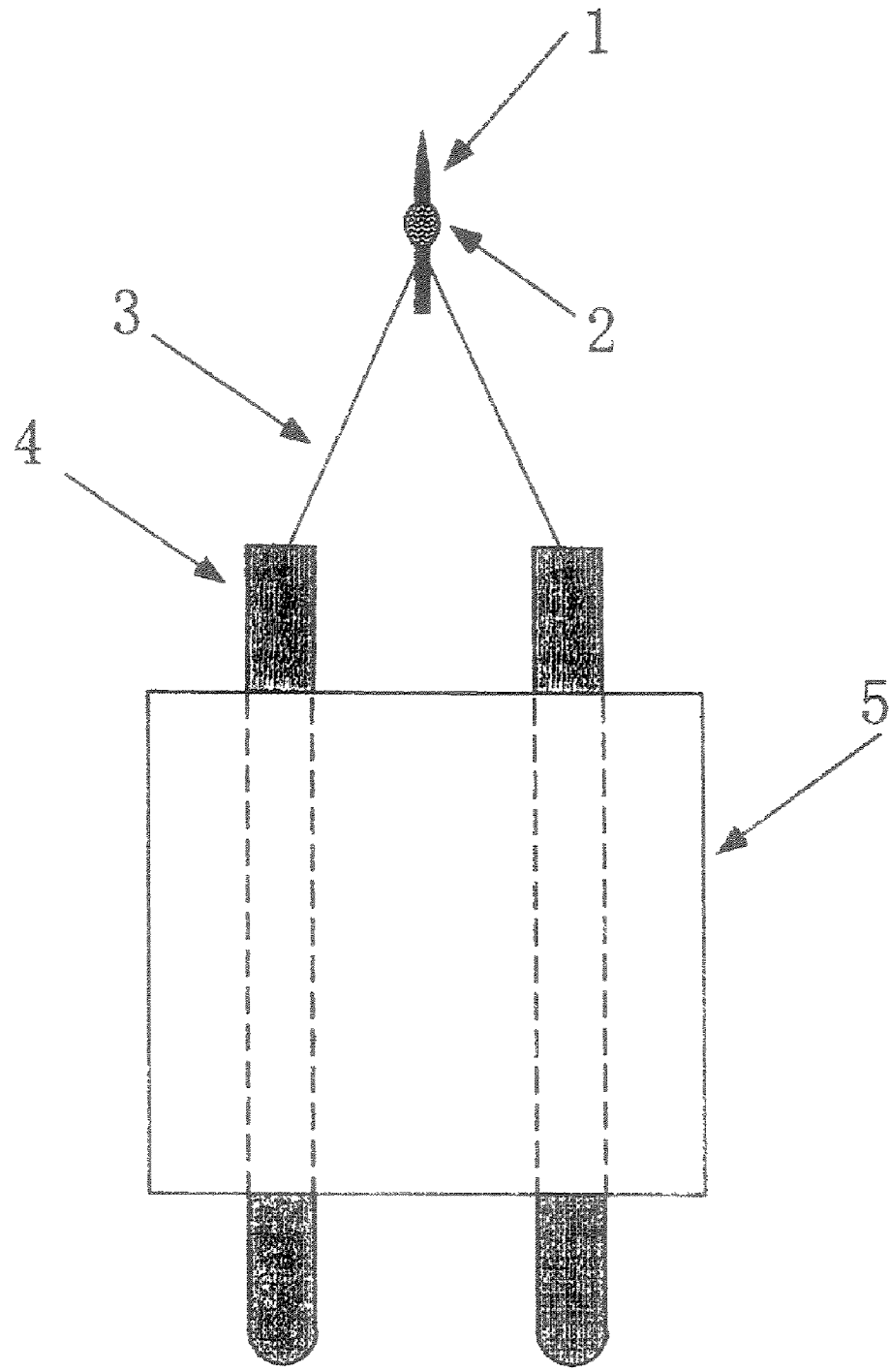
FIG. 1 is a structural view of a ZrO/W electron source.
Figure 2:
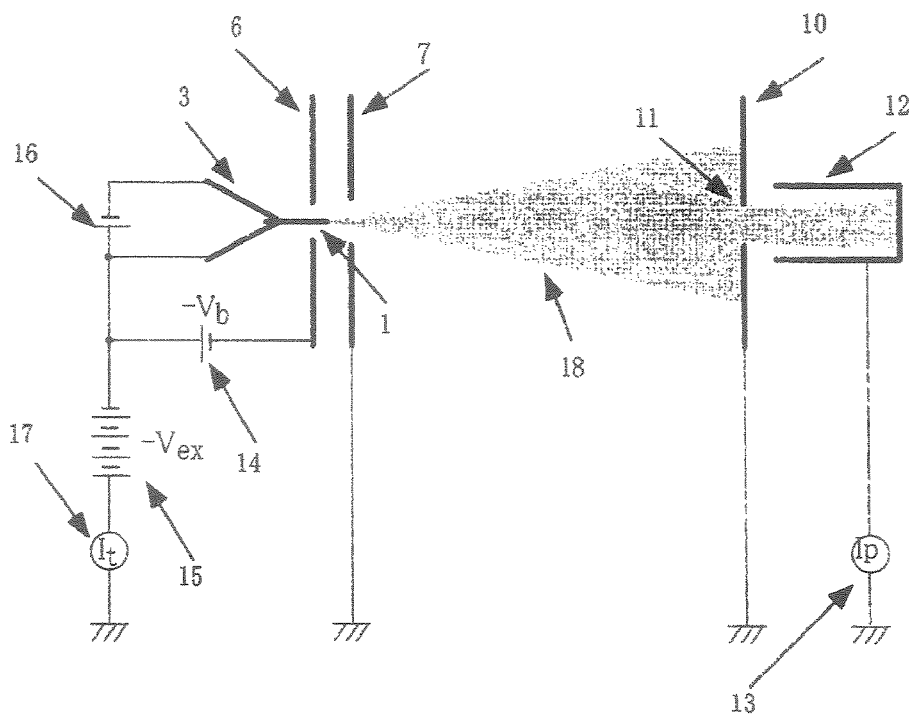
FIG. 2 is a structural view of an apparatus for evaluating electron emission characteristics.
Figure 3:
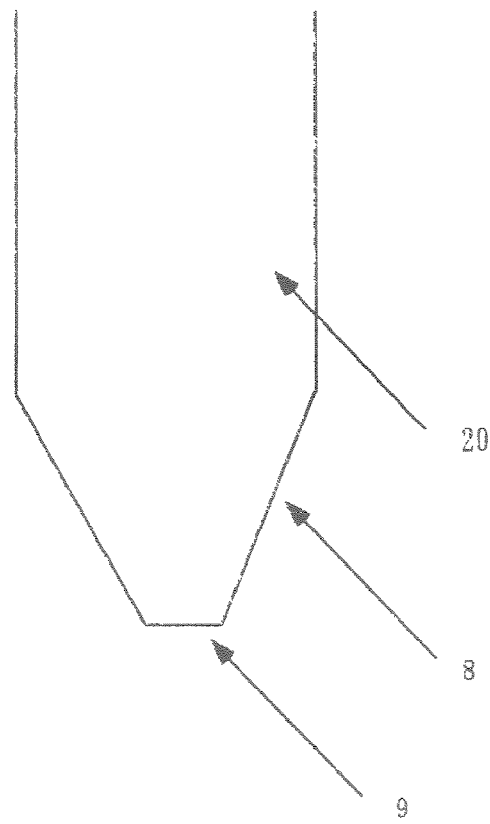
FIG. 3 is a structural view showing the shape of a cathode.

Zirconium hydride was pulverized and mixed with isoamyl acetate to obtain a paste, which was applied to a part of the cathode. After isoamyl acetate was evaporated, the cathode was introduced into the apparatus shown in FIG. 2. The forward end of the cathode 1 is disposed between a suppressor electrode and an extractor electrode. Here, the distance between the forward end of the cathode 1 and the suppressor electrode is 0.15 mm, the distance between the suppressor electrode and the extractor electrode is 0.8 mm, the pore size of the extractor electrode 7 is 0.8 mm, and the pore size of the suppressor electrode 6 is 0.8 mm.

The filament is connected of a filament heating power source and further connected to a high voltage power source, and a negative high voltage against the extractor electrode i.e. an extraction voltage $-Vex$ will be applied. Further, the suppressor electrode is connected to a bias power source, and a further negative voltage against the cathode and the filament i.e. a bias voltage $-Vb$ will be applied. Thermionic electrons emitted from the filament will thereby be shielded. The total emission current It from the electron source is measured by an ammeter disposed between the high voltage power source and an earth.

The electron beam emitted from the forward end of the cathode will pass through a pore of the extractor electrode and reach a phosphorous screen. At the center of the phosphorous screen, there is an aperture (a small pore), and a probe electric current It passed through the aperture and reached a cup-shaped electrode, will be is measured by an electric current ammeter. Further, when a solid angle calculated from the distance between the aperture and the forward end of the cathode and the inner diameter of the aperture is represented by ω, the angular intensity will Ip/ω.

Then, the interior of the apparatus was evacuated to an ultrahigh vacuum of $3\times10^{-10}$ Torr ($4\times10^{-8}$ Pa) whereupon an electric current was conducted to the filament to heat the cathode at 1,750 K thereby to thermally decompose $ZrH_2$ to metallic zirconium. Further, oxygen gas was introduced to bring the interior of the apparatus to $3\times10^{-6}$ Torr ($4\times10^{-4}$ Pa) to oxidize metallic zirconium thereby to form a diffusing source of zirconium and oxygen.

The interior of the apparatus was again evacuated to an ultrahigh vacuum of $3\times10^{-10}$ Torr ($4\times10^{-8}$ Pa), and while the cathode was maintained at 1,750 K, a bias voltage $-Vb=-500$ V was applied to the suppressor, and then a high voltage of extraction voltage $-Vex=-4$ kV was applied and maintained for a few hours. When the emission current was stabilized, with respect to the probe current Ip, the emission current distribution was measured. The results are shown in FIG. 7.

Figure 4:
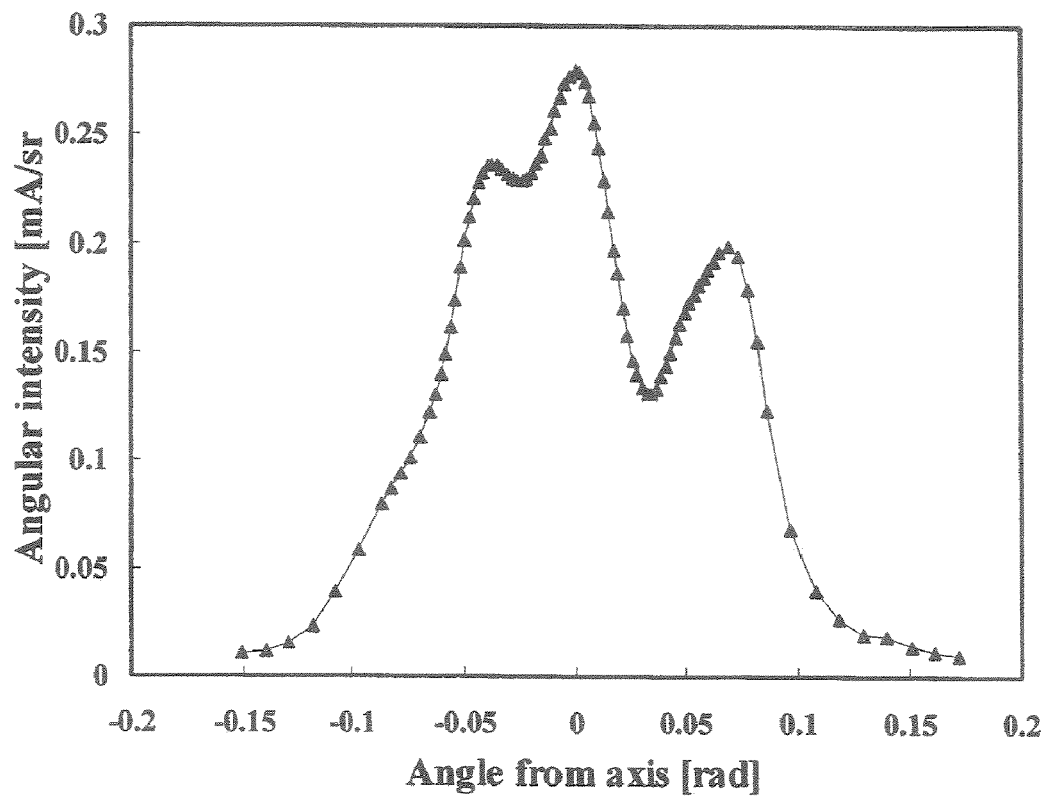
FIG. 4 shows an example of measurement of the conventional emission current distribution (Comparative Example).
Figure 5:
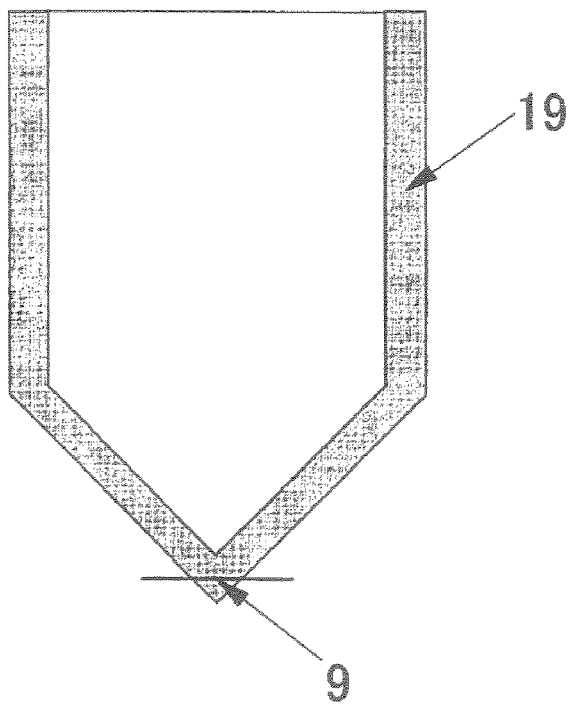
FIG. 5 is a schematic view illustrating a method for forming a flat portion of a conventional electron source.

Further, as a Comparative Example, the same production method as in Example was carried out except that no electrolytic polishing was carried out, and the results of measurement of the emission current distribution are shown in FIG. 4. It was confirmed that with the electron source obtained by the process for producing an electron source of the present invention, the uniformity in the emission current distribution is remarkably improved as compared with the Comparative Example.

INDUSTRIAL APPLICABILITY

According to the process of the present invention, an electron source excellent in the uniformity in the current emission distribution can be provided certainly and at a low cost. Accordingly, it is possible to constantly provide an electron source for e.g. a scanning electron microscope, an Auger electron spectroscopes, an electron beam lithography machine or a wafer inspection apparatus, particularly a highly reliable electron source suitable for an electron beam lithographic machine, such being industrially very useful.

The entire disclosure of Japanese Patent Application No. 2005-007012 filed on Jan. 14, 2005 including specification, claims, drawings and summary is incorporated herein by reference in its entirety.

The invention claimed is:

1. A process for producing an electron source, which comprises:
    forming a conical portion to constitute an electron emitting portion at one end of a rod by machining;
    removing a damaged layer of the conical portion by chemical polishing or electrolytic polishing;
    then forming a flat portion at the apex of the conical portion by machining; and
    removing a damaged layer of the flat portion by chemical polishing or electrolytic polishing.

2. The process for producing an electron source according to claim 1, wherein the rod is made of a single crystal of molybdenum or tungsten having a <100> orientation, and at the electron emitting portion has at least one metal element selected from the group consisting of Groups 2, 3, and 4 of the Periodic Table or a compound thereof, as a diffusing source.

3. The process for producing an electron source according to claim 2, wherein the metal element is at least one member selected from the group consisting of zirconium, titanium, scandium, yttrium, rare earth elements, barium, beryllium, magnesium, calcium, strontium and hafnium.

* * * * *